United States Patent
Hafen et al.

(10) Patent No.: US 10,660,222 B2
(45) Date of Patent: *May 19, 2020

(54) CUSTOMIZABLE MARKETING APPARATUS

(71) Applicant: MEDIA FAST, LC, American Fork, UT (US)

(72) Inventors: Amy Hafen, American Fork, UT (US); William Diaz, American Fork, UT (US)

(73) Assignee: MEDIA FAST, LC, American Fork, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/563,486

(22) Filed: Sep. 6, 2019

(65) Prior Publication Data
US 2019/0394891 A1 Dec. 26, 2019

Related U.S. Application Data

(63) Continuation of application No. 15/088,480, filed on Apr. 1, 2016, now Pat. No. 10,455,709.

(51) Int. Cl.
*H05K 5/00* (2006.01)
*B42D 15/00* (2006.01)
(Continued)

(52) U.S. Cl.
CPC ....... *H05K 5/0017* (2013.01); *B42D 15/0053* (2013.01); *G06Q 90/00* (2013.01); *G09F 1/10* (2013.01); *H05K 5/0086* (2013.01)

(58) Field of Classification Search
CPC ......... G09F 1/04; B42D 15/02; B42D 15/022; B42D 15/042
See application file for complete search history.

(56) References Cited

U.S. PATENT DOCUMENTS

D54,610 S    3/1920 Evans
4,484,768 A  11/1984 Norfleet
(Continued)

FOREIGN PATENT DOCUMENTS

WO    2016050966    4/2016
WO    2017172583    10/2017

OTHER PUBLICATIONS

Screen captures from YouTube video clip entitled "Coll Video Brochure Explainer," 3 pages, uploaded on Sep. 17, 2015 by user "DHD Films". Retrieved from Internet: <https://www.youtube.com/watch?v=OktljEMEU1Q> .

(Continued)

*Primary Examiner* — Gary C Hoge
(74) *Attorney, Agent, or Firm* — Workman Nydegger

(57) ABSTRACT

Embodiments are directed to systems, apparatuses, and methods for personalizing marketing materials such as video brochures. In one aspect, an electronic marketing system is provided that includes an electronic display device powered and a housing. A window is cut into the housing which allows the electronic display to be seen through at least a portion of the housing. A second window provides a view of an insert in the housing. A method is also provided for personalizing marketing materials and can include printing a custom design on an insert, cutting out at least a portion of the insert, arranging the cut out portion of the insert to show through a die cut window of the video brochure, and adhering the cut out portion of the insert to the video brochure in the arranged position.

18 Claims, 10 Drawing Sheets

(51) Int. Cl.
  *G06Q 90/00* (2006.01)
  *G09F 1/10* (2006.01)

(56) References Cited

U.S. PATENT DOCUMENTS

| | | | |
|---|---|---|---|
| D283,231 S | 4/1986 | Bradenburger | |
| 5,822,896 A * | 10/1998 | Milstein | B42D 15/042 40/124.07 |
| 5,845,425 A * | 12/1998 | Leake | A47G 1/14 40/725 |
| 6,209,924 B1 * | 4/2001 | Pyle | B42D 15/042 283/117 |
| D451,951 S | 12/2001 | Dusanter | |
| D602,516 S | 10/2009 | Miller | |
| D616,929 S | 1/2010 | Krivanek | |
| D629,458 S | 6/2010 | Clegg | |
| D629,459 S | 12/2010 | Clegg | |
| D632,330 S | 2/2011 | Qiao | |
| D632,734 S | 2/2011 | Qiao | |
| D642,611 S | 8/2011 | Clegg | |
| D643,060 S | 8/2011 | Clegg | |
| D647,559 S | 10/2011 | Clegg | |
| D649,588 S | 11/2011 | Clegg | |
| D654,113 S | 2/2012 | Clegg | |
| D655,750 S | 3/2012 | Clegg | |
| D659,754 S | 5/2012 | Rossiter | |
| D660,909 S | 5/2012 | Clegg | |
| D661,732 S | 6/2012 | Clegg | |
| D745,605 S | 12/2015 | Dancausse | |
| D755,895 S | 5/2016 | Garfinkle | |
| D784,455 S | 4/2017 | Sims | |
| D790,007 S | 6/2017 | Knight | |
| 2003/0098581 A1 * | 5/2003 | Cundiff | B42D 15/02 283/116 |
| 2006/0097030 A1 * | 5/2006 | Corr | B42F 13/0053 229/67.1 |
| 2011/0088293 A1 * | 4/2011 | Mason | B42D 15/022 40/124.03 |
| 2011/0154698 A1 * | 6/2011 | Lin | B42D 15/022 40/124.03 |
| 2011/0247247 A1 * | 10/2011 | Mayer | B42D 15/022 40/124.03 |
| 2017/0297360 A1 * | 10/2017 | Milon | B42D 15/022 |

OTHER PUBLICATIONS

Video Brochure, (Video Plus Print) [online], [retrieved on Apr. 18, 2019] <URL: https://www.videoplusprint.com/video-brochure.html>.

Helping You Create a Successful Video Brochure for Your Business, (Curveball) [online], [retrieved on Apr. 18, 2019] <URL: http://www.curveballprintedmedia.com/video-brochures-welcome/?gclid=EAlalQobChMIzqD4qKzI4AlVwkCGCh2G2A_1EAAYAiAAEgL80_D_BwE>.

Download Templates, (Mediawrite) [online], [retrieved on Apr. 18, 2019] <URL: https://www.mediawrite.com/download/>.

Video brochures and video mailers, (redpaperplane by Structural Graphics) [online], [retrieved on Apr. 18, 2019] <URL: https://www.redpaperplane.com/store/creative-direct-mail/videobrochures?mode=grid>.

Video in Print, (americhip) [online], [retrieved on Apr. 18, 2019] <URL: https://www.americhip.com/product/video-in-print.html>.

Product Overview, (Video Smartbooks LLC) [online], [retrieved on Apr. 18, 2019] <URL: https://www.videosmartbooks.com/product-overview/?gclid=EAlalqobChMI_-qjvrbl4AlVB41pCh3q6AbOEAMYAyAAEgJL3_D_BwE>.

Gallery, (Idealcontent) [online], [retrieved on Apr. 18, 2019] <URL: https://idealcontent.com/gallery/>.

Video Business Cards, Video Brochures & Video Mailers, (the videocards.com) [online], [retrieved on Apr. 18, 2019] <URL: https://www.thevideocards.com>.

Video in Print, (Structural Graphics) [online], [retrieved on Apr. 18, 2019] <URL: https://www.structuralgraphics.com/work/video-in-print>.

Cirque de Baby, https://cirquedebaby.wordpress.com/category/pregnancy-2/ultrasounds-and-appointments/, Sep. 25, 2013. (Year: 2013).

* cited by examiner

CUSTOMIZABLE MARKETING APPARATUS

CROSS-REFERENCE TO RELATED APPLICATIONS

This application claims priority to and the benefit of U.S. patent application Ser. No. 15/088,480, filed Apr. 1, 2016 and titled "CUSTOMIZABLE MARKETING APPARATUS," which is incorporated herein by this reference in its entirety.

BACKGROUND

All businesses have an ongoing need to market the goods and services they provide. In many cases, businesses use mailers, brochures, radio and television advertisements, internet advertisements and other marketing items that provide information about their business. The physical marketing material may come in a variety of sizes from magazine-sided catalogues and brochures to pamphlets and individual business cards.

Business cards are commonly exchanged between individuals as a means of passing along contact information. The business cards are typically constructed solely from paper, and do not contain any active elements. Recently, electronic elements have been added to business cards, brochures and other marketing items in order to provide additional content that cannot be provided via a traditional piece of marketing material.

For example, video screens have been added to marketing materials, along with batteries, speakers, buttons and other simple electronics. The video screens may be programmed to automatically start playing a prerecorded media segment relating to the business when a section of the brochure is opened. When such screens are added to marketing materials, the materials are often referred to as video brochures or video business cards. Video brochures may be manufactured using inexpensive structural materials and electronic components. This reduces their cost and makes them practical to give to people that are interested in the business.

Traditional manufacturing processes typically require that a large number of video brochures be produced when a given run is initiated. Because of the current nature of the brochures, businesses are unable to make customized video brochures and other electronic marketing material in small quantities, or at least not cheaply enough to make them economically feasible. For example, a business may want to make a personalized video brochure for a single user or for a small group of users that is unique to that user or group of users. Using current electronic marketing materials, the business would need to pay a large sum of money to produce the customized and personalized brochures. Accordingly, improvements can be made to allow personalized video brochures to be produced at a small scale.

BRIEF SUMMARY

Embodiments described herein are directed to systems, apparatuses and methods for personalizing marketing materials such as video brochures. In one embodiment, an electronic marketing system is provided. The electronic marketing system includes an electronic display device and a housing. A first window is formed by the housing that allows the electronic display to be seen through at least a portion of the housing. A second window is formed in the housing and can, for example, provide a view of an insert in the housing.

In another embodiment, a system is provided that includes an electronic display and a housing that forms first and second windows. The first window allows the display to be viewed through at least a portion of the housing. The second window shows various portions of customized printing on an insert associated with the housing.

In another embodiment, a method is provided for personalizing a video brochure. The method includes the steps of printing a custom design on an insert, arranging the insert to show through a die cut window of the video brochure, and adhering the insert to the video brochure in the arranged position.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be apparent to one of ordinary skill in the art from the description, or may be learned by the practice of the teachings herein. Features and advantages of embodiments described herein may be realized and obtained by means of the instruments and combinations particularly pointed out in the appended claims. Features of the embodiments described herein will become more fully apparent from the following description and appended claims.

BRIEF DESCRIPTION OF THE DRAWINGS

To further clarify the above and other features of the embodiments described herein, a more particular description will be rendered by reference to the appended drawings. It is appreciated that these drawings depict only examples of the embodiments described herein and are therefore not to be considered limiting of its scope. The embodiments will be described and explained with additional specificity and detail through the use of the accompanying drawings in which.

DETAILED DESCRIPTION

Figure 1A:
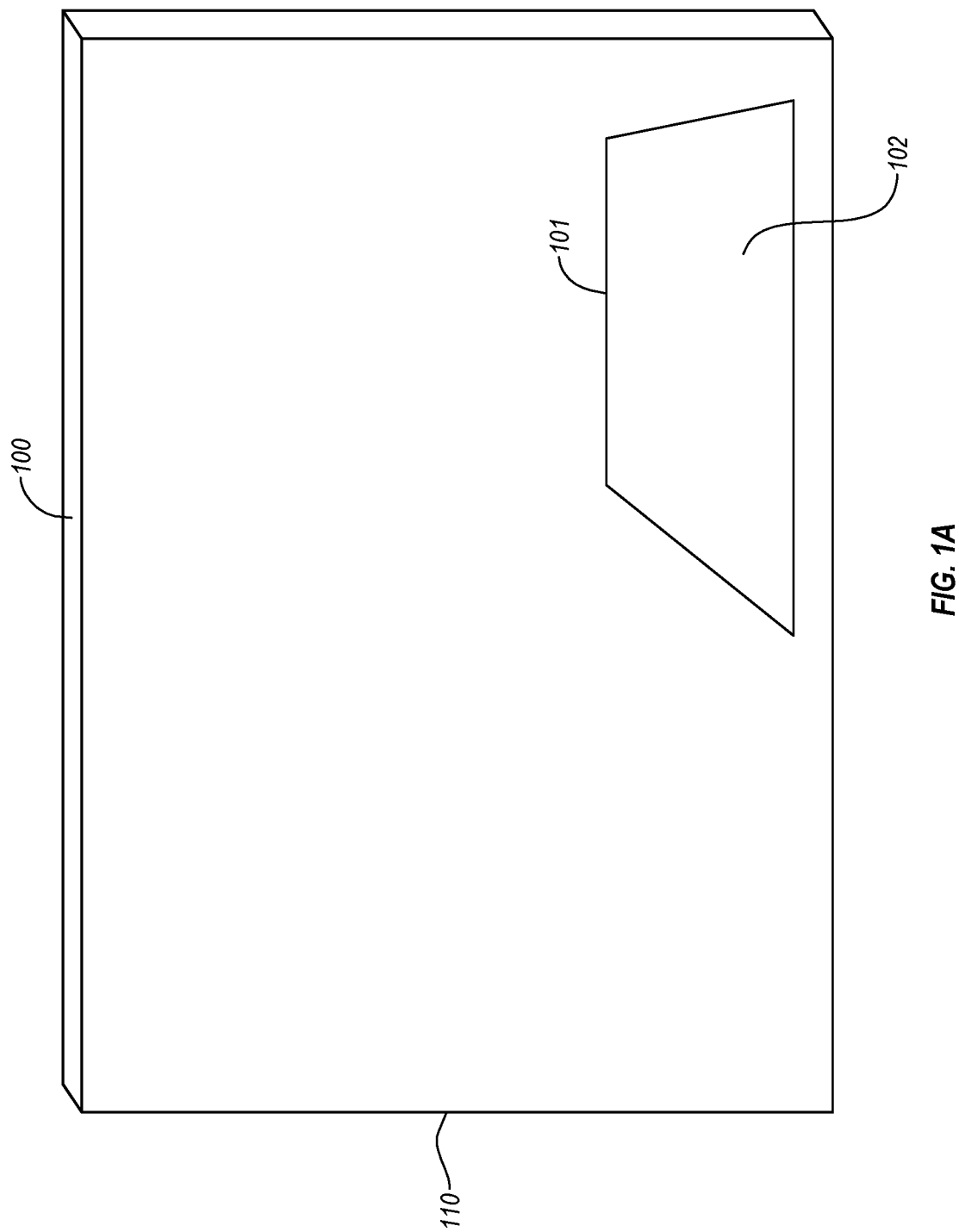
FIG. 1A illustrates an embodiment of an electronic marketing apparatus in which a first design appears through a window.

Embodiments described herein are directed to systems, apparatuses and methods for personalizing marketing materials such as video brochures. In one embodiment, an electronic marketing apparatus is provided. The electronic marketing apparatus includes a battery, an electronic display device powered by the battery, and a housing. A first window is cut into the housing which allows the electronic display to be seen through at least a portion of the housing. A second window provides a view of an insert in the housing that is printed using a commodity printer.

In another embodiment, a system is provided which includes one or more microprocessors, an electronic display, and a housing that includes a first window. The first window allows the display to be viewed through at least a portion of the housing. The housing also includes a second window that shows various portions of customized printing on an insert printed using a commodity printer.

In another embodiment, a method is provided for personalizing a video brochure. The method includes the steps of printing a custom design on an insert using a commodity printer, cutting out at least a portion of the insert, arranging the cut out portion of the insert to show through a die cut window of the video brochure, and adhering the cut out portion of the insert to the video brochure in the arranged position.

Embodiments described herein may implement a computing system. The computing system may be incorporated into a housing, and may include, for example, a microprocessor, a sensor, a battery, a speaker and an electronic display. The microprocessor may include embedded code which it is configured to execute upon triggering by the sensor or other trigger. The microprocessor may, for example, execute code that processes and displays a video or stationary image that is displayed in the electronic display. Thus, the term "computing system" includes any device, system, or combination thereof that includes at least one processor or microprocessor, and a physical and tangible computer-readable memory capable of having thereon computer-executable instructions that are executable by the processor (this computer-readable memory may store the movie or image, for example).

As broadly defined herein, a computing system may include at least one processing unit and memory. The memory may be physical memory, which may be volatile, non-volatile, or some combination of the two. The memory and the microprocessor may be powered by a battery that is embedded in or otherwise attached to the housing of the marketing apparatus described above. The code executed by the microprocessor may be referred to as an "executable module" or "executable component," and can refer to software objects, routines, methods, or similar computer-executable instructions that may be executed on the computing system. For example, different videos or images may be displayed on the electronic display based on which sensor(s) has/have been triggered or which buttons have been pushed on the electronic marketing apparatus.

In some cases, the electronic marketing apparatus (or the computing system therein) may also contain communication channels that allow the computing system to communicate with other message processors over a wired or wireless network. Such communication channels may include hardware-based receivers, transmitters or transceivers, which are configured to receive data, transmit data or perform both.

Referring to the figures, FIG. 1A illustrates an electronic marketing apparatus 100 with various components and features. The implementations described herein can include a plurality of independent components that each contribute to the functionality of the apparatus as a whole. This modularity allows for increased flexibility when approaching issues of platform scalability and, to this end, provides a variety of advantages. Complexity and growth can be managed more easily through the use of smaller-scale parts with limited functional scope. Fault tolerance is enhanced through the use of these loosely coupled modules. Individual components can be grown incrementally as business needs dictate. Modular development also translates to decreased time to market for new functionality. Thus, new functionality can be added or subtracted without impacting the core apparatus.

The electronic marketing apparatus 100 includes a housing 110. The housing may be of substantially any shape or size. For example, housing 110 may be the approximate size of a business card or wallet-sized card. Alternatively, the housing 110 may be brochure or pamphlet sized. Still further, the housing 110 may be approximately book sized or larger. One skilled in the art will recognize that the size and shape may be varied depending on various design considerations and purpose of the apparatus. In some cases, the shape of the housing 110 may be round, in others square, rectangular, triangular or some other shape. The housing 110 may be made of paper, cardboard, cardstock or any other type of material.

The housing 110 may have one or more windows 101 cut into it, such as the window 101 of FIG. 1A. The window 101, like the housing 110, may be of substantially any size or shape. The window 101 of FIG. 1A is trapezoidal in nature, and allows material behind the window to be seen. For instance, a business or other entity may provide a logo, name or other design 102 to appear behind the window 101. In some cases, the logo, name or design 102 may be printed on an insert that is inserted into the housing. This insert (or at least a portion thereof) is then viewable through the window 101.

The insert may be a cardstock insert, for example. The cardstock insert may be printable in a commodity printer. As the term is used herein, a "commodity printer" refers to a printer that is commonly purchased by average end users with average printing needs. A commodity printer is one found in traditional consumer electronics stores, and likely does not include more advanced features that are only found in commercial printers. The intent of the term "commodity printer" is to convey that it is a printer that is available to the average person, and is not a piece of specialized printing equipment typically only available (or only affordable) by an institution such as a business. Printing on a cardstock insert enables personalization by each individual user, and printing on a much smaller scale. Indeed, it will be understood that professional printing often requires batches of hundreds or thousands of units. The embodiments herein can be economically printed in much smaller quantities (even a quantity of one), and can be individually customized by each user or each business.

Figure 1B:
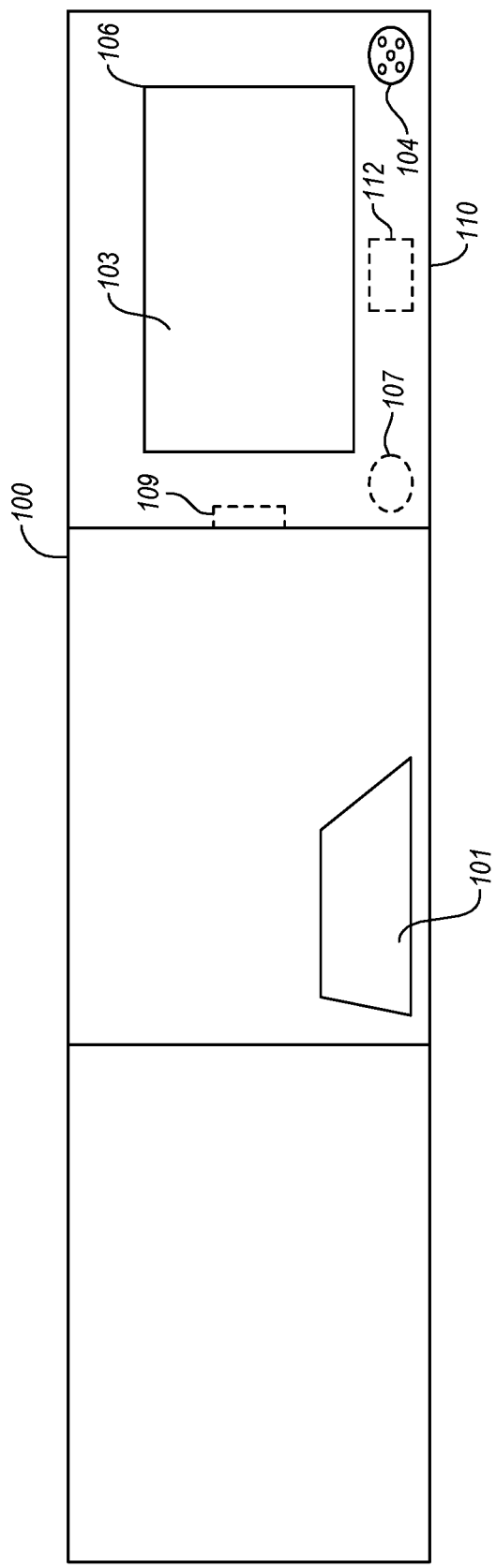
FIG. 1B illustrates an embodiment of the electronic marketing apparatus in which the apparatus is unfolded and open for view.

As shown in FIG. 1B, the housing 110 of the electronic marketing apparatus 100 may be folded one or more times. While the embodiment in FIG. 1B shows two folds, it will be understood that substantially any number of folds may be implemented in the housing 110. The window 101 is shown from the rear, suggesting that if the leftmost flap is folded to the right, and then those flaps together are folded over the rightmost flap, then the window 101 will appear as shown in FIG. 1A. The electronic marketing apparatus 100 includes another window 106 which shows an electronic display 103. The electronic display 103 may be any type of electronic display including a liquid crystal display (LCD), a light-emitting diode (LED) display, an organic LED (OLED) display or any other display means that is capable of displaying images or videos.

The electronic display 103 may be powered by a battery 107. Similar to other components described herein, the battery may be any type of battery, and may be larger or smaller depending on the application and the size of the display 103, the microprocessor 112, the speaker 104 and any other electronic components. In some cases, multiple batteries may be used simultaneously, or some of the batteries may function as backups for the primary batteries. The microprocessor 112 may be configured and designed to communicate with the electronic display 103, with the speaker 104, with various sensors 109 or buttons (e.g. 111A/111B), with communications systems such as a radio frequency identifier (RFID), Bluetooth, WiFi, or global positioning system (GPS) radios or other transceivers, with data ports such as universal serial bus (USB) ports or with other electronic components.

The sensors 109 may include piezoelectric sensors, inductive sensors, capacitive sensors, resistive sensors or any other type of sensors may be implemented on or in the electronic marketing apparatus 100. For instance, a sensor 109 may be implemented at a fold to determine when the housing 110 unfolded. Upon unfolding, the sensor 109 may send a signal to the microprocessor 112 indicating that a video is to be played on the electronic display 103, or that an image is to be shown. The microprocessor 112 may then initiate playback of the movie or image. Other types of sensors may also be implemented including biometric sensors (e.g. fingerprint, iris, voice, etc.), touch screen sensors or other types of sensors. Indeed, depending on which sensor is activated, or depending on the extent to which each sensor is individually activated, different actions may be triggered.

Figure 1C:
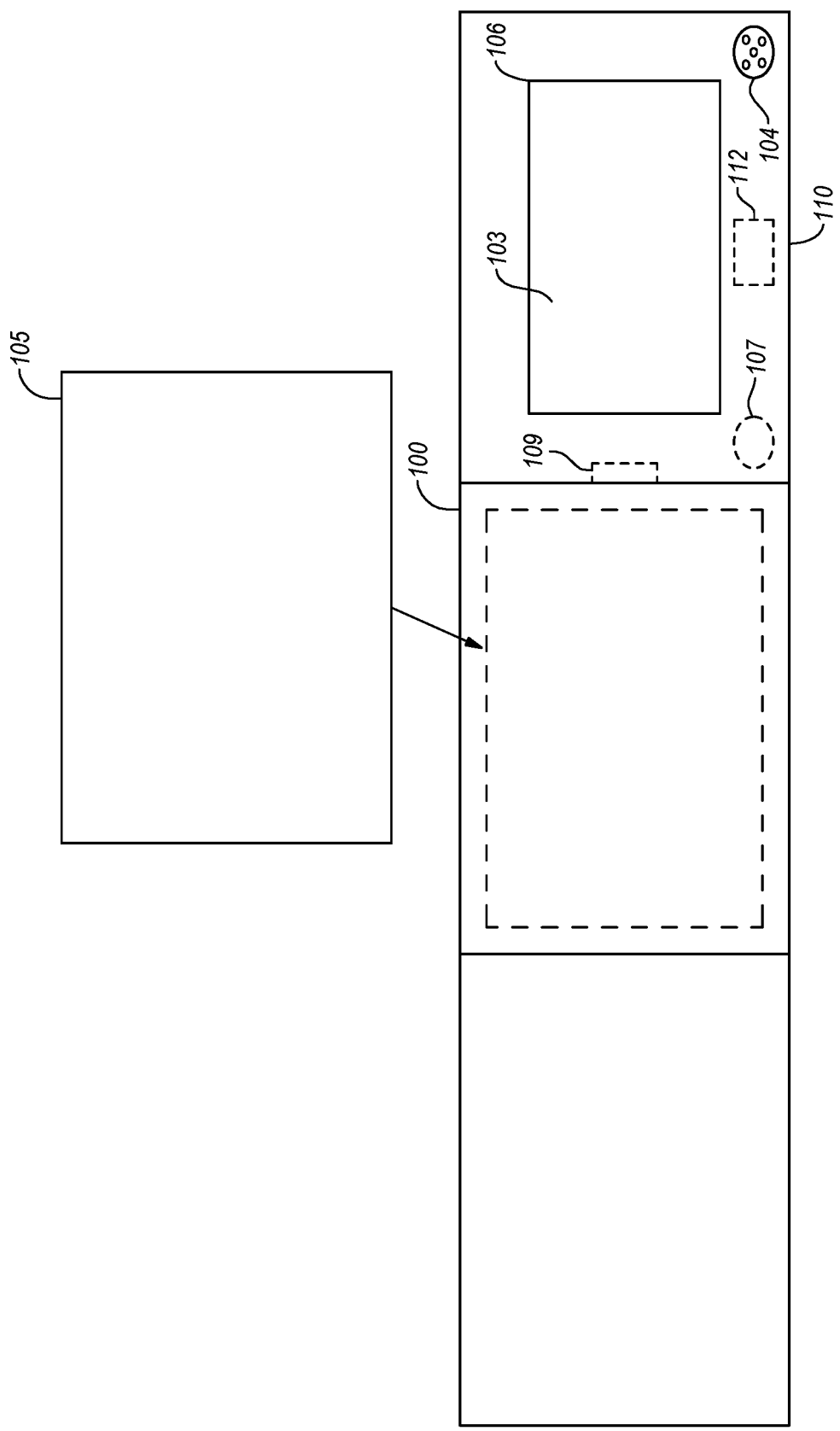
FIG. 1C illustrates an embodiment of the electronic marketing apparatus in which an insert is inserted into the apparatus.

FIG. 1B thus illustrates an embodiment of an electronic marketing apparatus 100 that includes a battery 107, an electronic display device 103 powered by the battery, a housing 110 and an optional speaker 104. A window 106 is cut into the housing 110 allowing the electronic display 103 to be seen through at least a portion of the housing, and a second window 101 provides a view of an insert in the housing that is printed using a commodity printer. FIG. 1C illustrates an example insert 105 that is inserted into the housing 110. The insert 105 may be inserted in between layers of the housing, or may be adhered a surface of the housing. For example, the insert 105 may be adhered to a surface of the housing 110 using tape, glue, sticky tack or some other adhering means.

The insert 105 (or at least a portion thereof) may be printed using a commodity printer. For example, a business or other entity may print a business name, logo, design, image or other item on the insert 105. The printing may be accomplished with a commodity printer that is a non-specialized printer available to average consumers via traditional sales channels. Thus, in this manner, the business or other entity may print a single insert, if desired, and place it in the housing 110 to create a personalized video brochure.

Figure 1D:
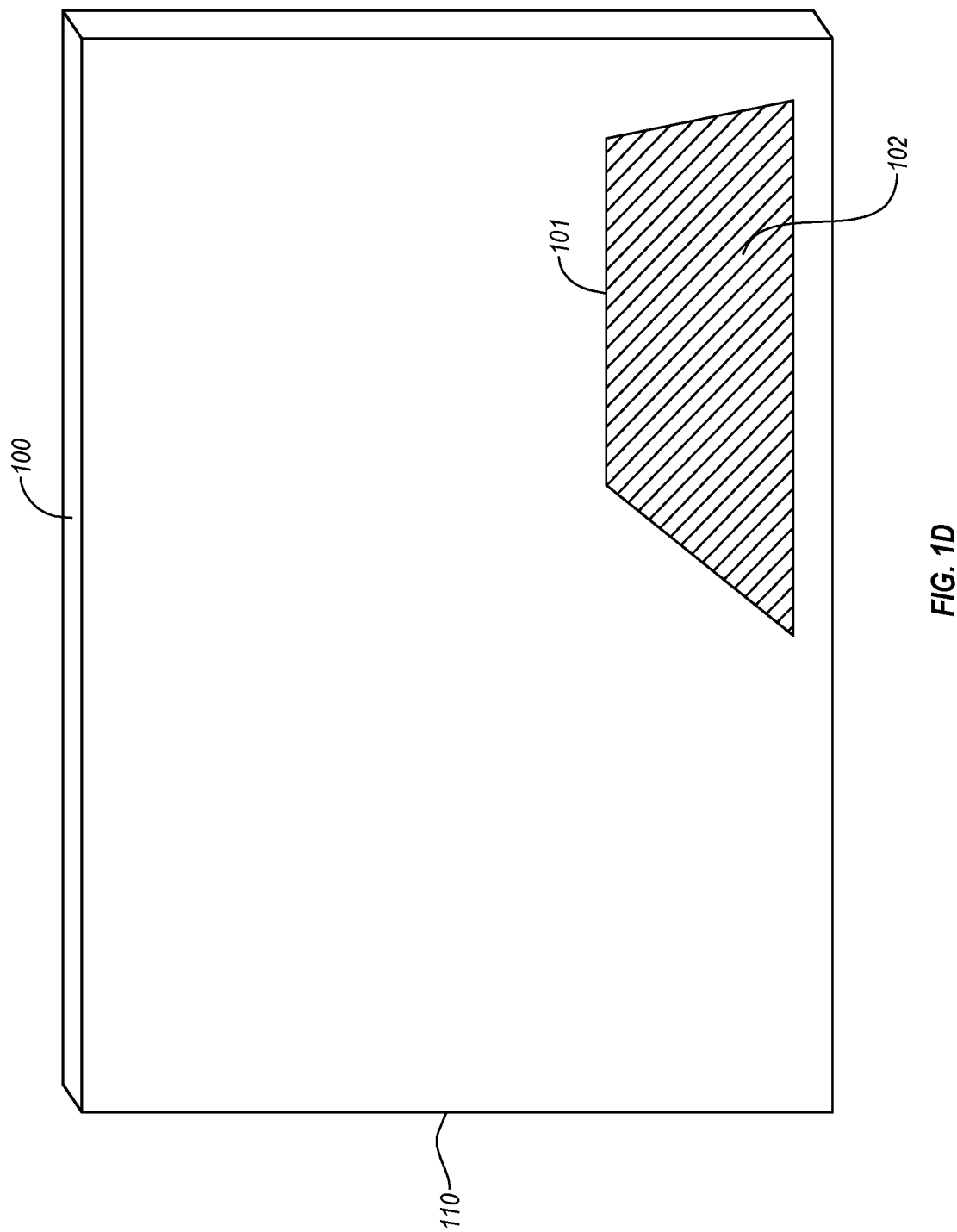
FIG. 1D illustrates an embodiment of the electronic marketing apparatus in which a second different design appears through the window.

As shown in FIG. 1D, the electronic marketing apparatus 100 is shown in a front-facing view, with a different logo or design 102 placed behind the window 101. This logo or design may be printed on the insert 105 of FIG. 1C and may be arranged so that it shows through the window 101. Thus, as can be seen, the logo or design shown in FIG. 1A is different than that shown in FIG. 1D. Because the insert 105 is interchangeable, the owner of the marketing apparatus may change out the insert in order to change the appearance and the overall personalization of the apparatus.

In some embodiments, the windows 101 and 106 in the housing 110 may be die cut. The die cut may provide a professional fit and finish for the windows, and further allows for various shapes to be cut into the housing 110 for the window. For example, a user may draw or design a window, and the window may then be die cut into the housing 110. A user may select the shape and size of the window. Furthermore, if multiple windows are to be cut into the face of the housing 110, each of the windows may be user-defined including size, shape and position on the housing.

Like the size and shape of the window 101, the printing on the insert 105 and/or on the housing 110 may be user-defined. For instance, the printing may include custom printing that has user-selected patterns, a name, an image, a logo or some other user-selected item. In some cases, a pattern identifying the size, shape and location of the window 101 is transmitted to a commodity printer prior to printing, so that the custom printing may be carried out on the insert 105 and/or on the housing 110.

The insert 105 may be a cardstock insert, a cardboard insert, a paper insert or other type of insert. The insert 105 may be of substantially any size or shape or thickness. In cases of cardstock and paper inserts, the inserts are printable on commodity printers. Thus, a user can design the size and shape of the window 101, and can design or select the image shown through the window, whether the image is printed on the housing 110 directly, or printed on an insert 105. If the image or other design is printed on a cardstock insert, that cardstock insert may then be inserted into the housing 110 of the electronic marketing apparatus. The cardstock insert 105 is then viewable through the window 101 in the housing 110.

In some cases, the cardstock insert (or at least a portion thereof) is cut out. For example, the portion of the cardstock insert that has the printed image or design may be cut out. This cut out portion may then be arranged behind the window 101. Thus, the insert 105 may be largely blank except for the custom printed-portion, or may have the custom-printed portion cut out. This cut out portion may be adhered to the surface of the housing 110 such that it is arranged over the window 101. In this manner, the cut out portion is visible to users through the window 101.

Figure 2A:
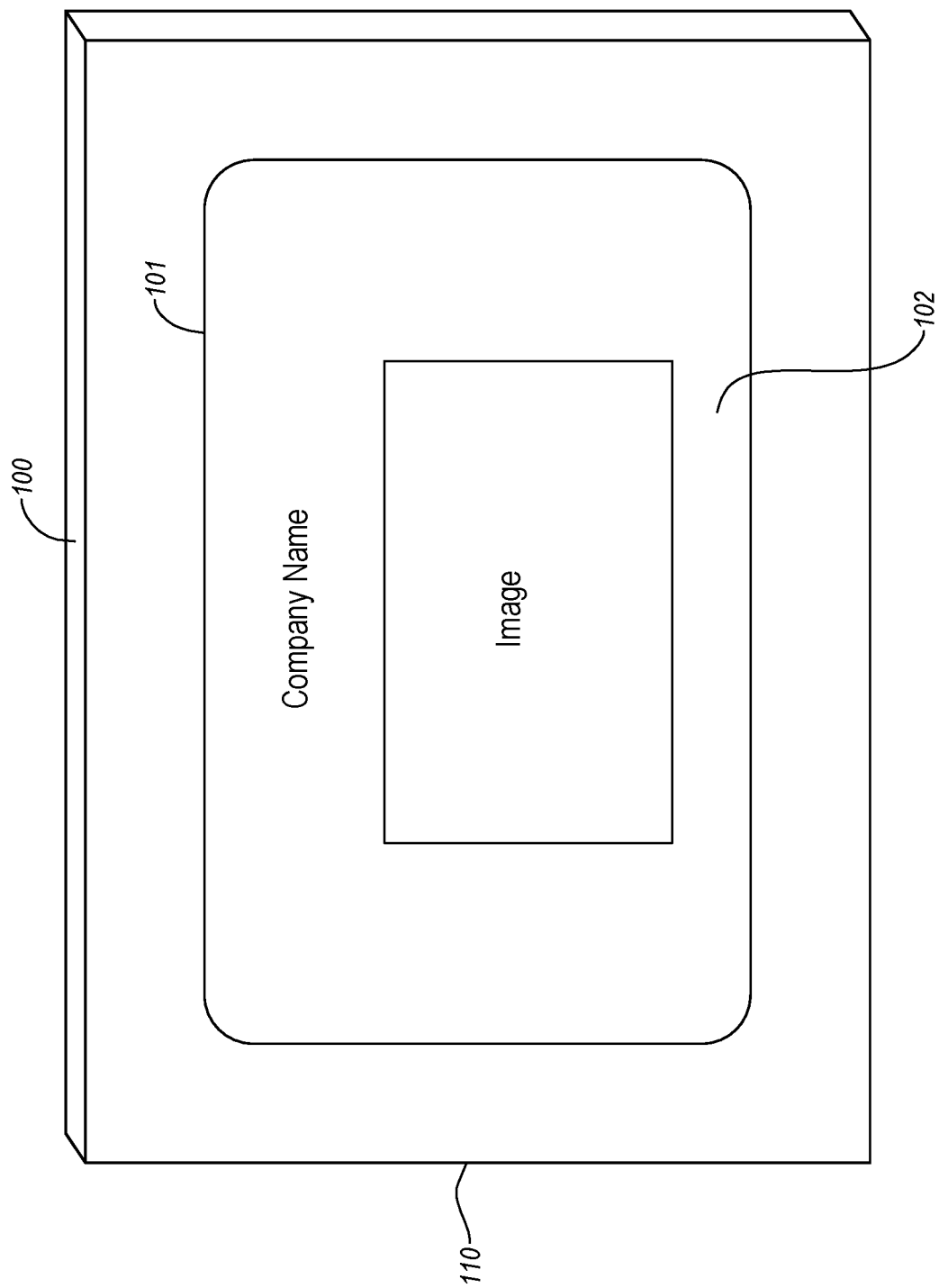
FIG. 2A illustrates an embodiment of the electronic marketing apparatus in which the apparatus has a specially designed company name and image in the window.

As shown in FIG. 2A, the window 101 may be a different size and shape than that shown in FIGS. 1A-1D. Indeed, in FIG. 2A, the shape is a square, and the size is much larger than in FIGS. 1A-1D. The custom printing 102 in FIG. 2A comprises a logo, design, name or other printable image. The custom printing 102 is visible through the window 101 and is prominently displayed for the user to see on the front surface of the marketing apparatus 100.

Figure 2B:
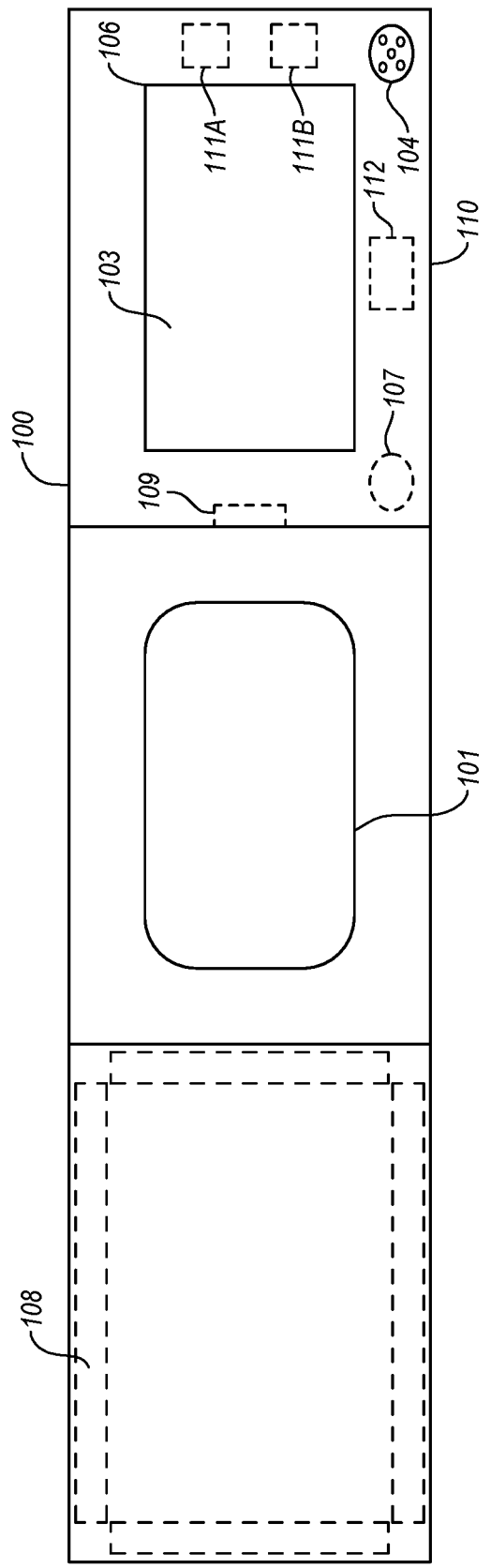
FIG. 2B illustrates an embodiment of the electronic marketing apparatus in which the apparatus is unfolded and open for view.

FIG. 2B illustrates a system that includes one or more microprocessors 112, an electronic display 103, and a housing 110 that includes a first window 106. The first window allows the display 103 to be viewed through at least a portion of the housing 110. The housing 110 further includes a second window 101 that shows portions of customized printing on an insert (e.g. 105 from FIG. 1C) printed using a commodity printer. The system of FIG. 2B also includes one or more sensors 109 which may be configured to activate upon a user opening a flap or pressing a button or upon touching a certain part of the housing 110. The output from the sensors may be configured to trigger an action. The action may be to display an image or movie on the electronic display 103. The microprocessor 112 thus receives the sensor signals and performs processing as indicated in computer-executable instructions stored in embedded memory or in some other type of computer memory.

The system of FIG. 2B may also include buttons 111A and 111B that allow a user to interact with the system. For instance, the buttons 111A and 111B may be volume buttons that control the volume of speaker 104. Additionally or alternatively, other buttons may be embedded within or attached on the external surface of the housing 110. These other buttons may turn the electronic display on or off, or may control brightness of the display, or may allow control of the video (e.g. pause, fast forward, rewind or play buttons). Still other buttons may control use of devices connected to the system via USB or via some other connection port. Thus, it will be apparent to one skilled in the art that many different buttons and types of buttons may be implemented on and arranged on the electronic marketing apparatus 100 of FIG. 2B.

In some embodiments, the window 101 is die cut into the housing 110. In such cases, as in FIG. 2B, an insert 105 (such as a cardstock insert) may be attached and sealed via an adhesive. For example, the insert may be attached using tape 108 or some other adhesive. Adhering the insert in this manner creates a fit and finished appearance for the marketing apparatus 100. In the case of high-end video brochures, this method of personalization maintains the perceived value necessary for a video brochure. The die cut window 101 allows users to personalize graphic designs by printing them on an insert or printing them directly on the housing. The graphic designs are then visible through the die cut window 101. The finished size of the apparatus is variable and can be changed for different applications.

Figure 3:
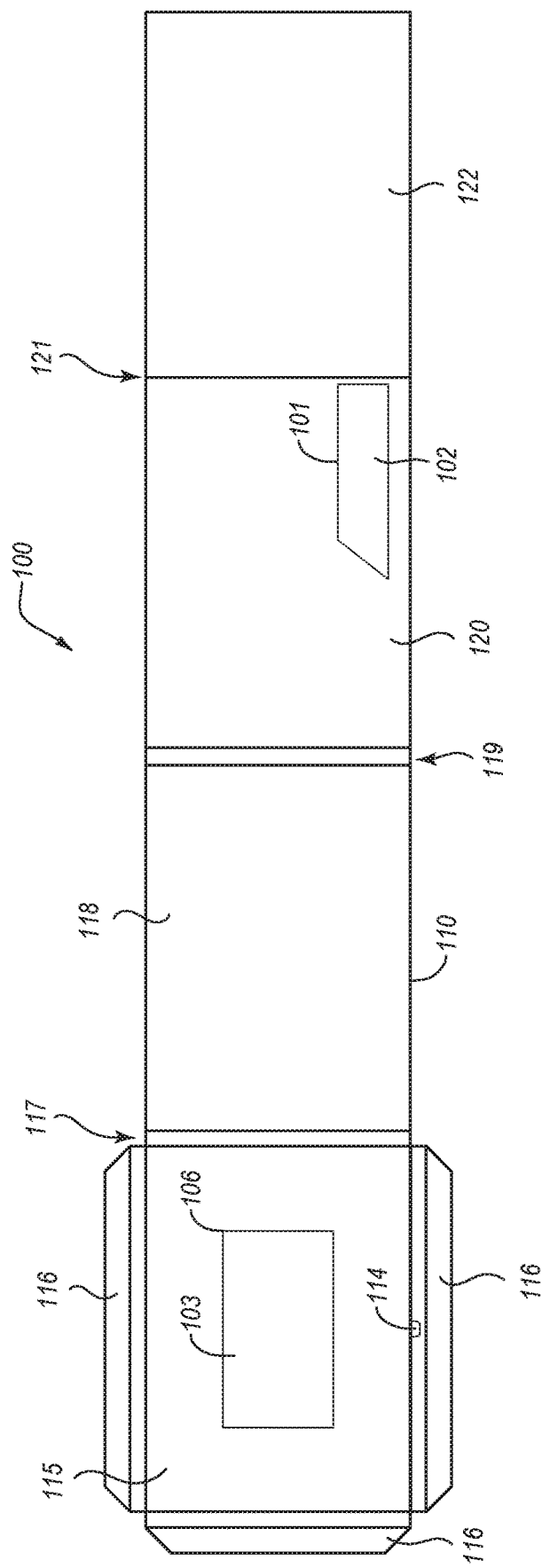
FIG. 3 illustrates an embodiment of the electronic marketing apparatus in which the apparatus is approximately brochure-size.

As mentioned above, the size, shape and placement of the die cut window is also variable and may be personalized by the user as desired. FIG. 3, for example, illustrates an embodiment of an electronic marketing apparatus 100 in which the apparatus is approximately brochure-size. Thus, the embodiment of FIG. 3 shows an unfolded example of an electronic marketing apparatus that can be folded together, such as the apparatus shown in FIG. 1A. As shown in FIG. 3, the housing 110 includes a first flap 115 having a plurality of tabs 116 extending directionally away from the first flap 115. The first flap 115 additionally defines a first window 106 formed within the inner area of the first flap 115. The housing 110 additionally includes a first fold 117 positioned between the first flap 115 and a second flap 118 that is adjacent to the first flap 115, a second fold 119 positioned between the second flap 118 and a third flap 120 that is adjacent to the second flap 118, and a third fold 121 positioned between the third flap 120 and a fourth flap 122 that is adjacent to the third flap 120. The third flap 120 defines a second window 101 within the inner area of the third flap 120. The plurality of tabs 116 of the first flap 115 are configured to be folded toward the second flap 118 to maintain a space between the first flap 115 and the second flap 118 when the first flap 115 is folded over the second flap 118 at the first fold 117. FIG. 3 illustrates the first window 106 as a rectangular window 106 for the video screen 103, and illustrates the second window 101 as a somewhat trapezoidal.

Figure 4:
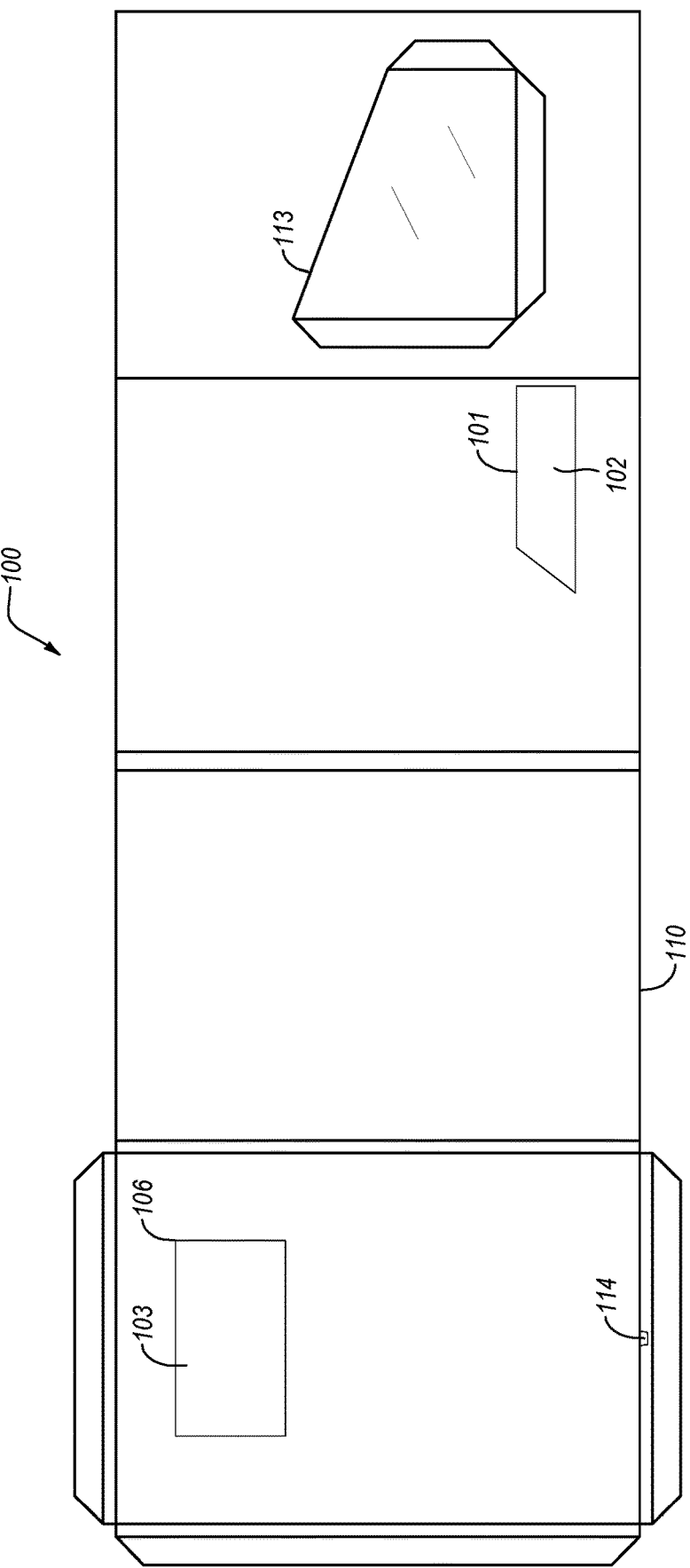
FIG. 4 illustrates an embodiment of the electronic marketing apparatus in which the apparatus is approximately A4 paper-size.
Figure 5:
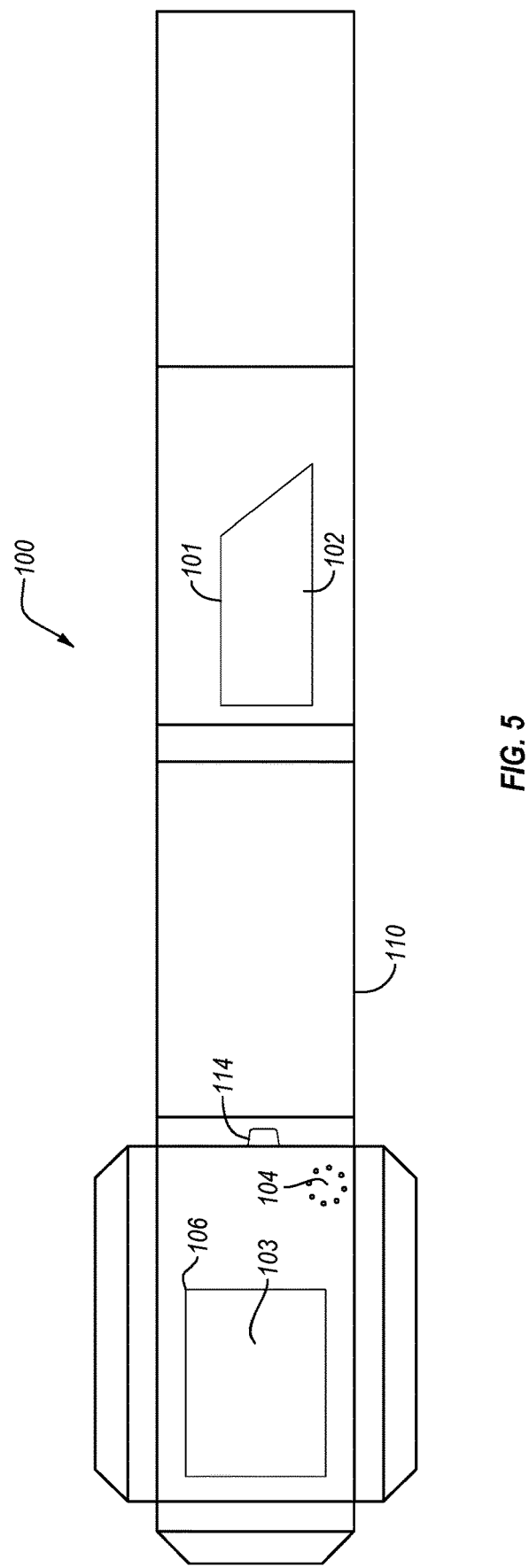
FIG. 5 illustrates an embodiment of the electronic marketing apparatus in which the apparatus is approximately business card-size.

FIG. 4 illustrates an embodiment of the electronic marketing apparatus 100 in which the apparatus is approximately A4 paper-size. FIG. 4 also illustrates a pouch 113 that may be attached to various surfaces of the apparatus 100. The pouch may be added to hold additional materials, and may be adhered to substantially any surface on the apparatus. FIG. 5 illustrates an embodiment of the electronic marketing apparatus 100 in which the apparatus is approximately business card-size. FIG. 5 additionally illustrates a universal serial bus (USB) port 114 that is reachable through the housing 110. The USB port may allow connections with other electronic devices or computing systems.

It will be understood that while a USB port is shown in FIG. 5, any of a variety of different communication ports may be implemented in the electronic marketing apparatus 100, and in some cases, multiple communication ports may be implemented in the same apparatus. The business card-size nature of the embodiment shown in FIG. 5 allows the apparatus to be easily carried in a pocket or purse, and easily exchanged with others. These concepts will be explained further below with regard to method 600 of FIG. 6.

Figure 6:
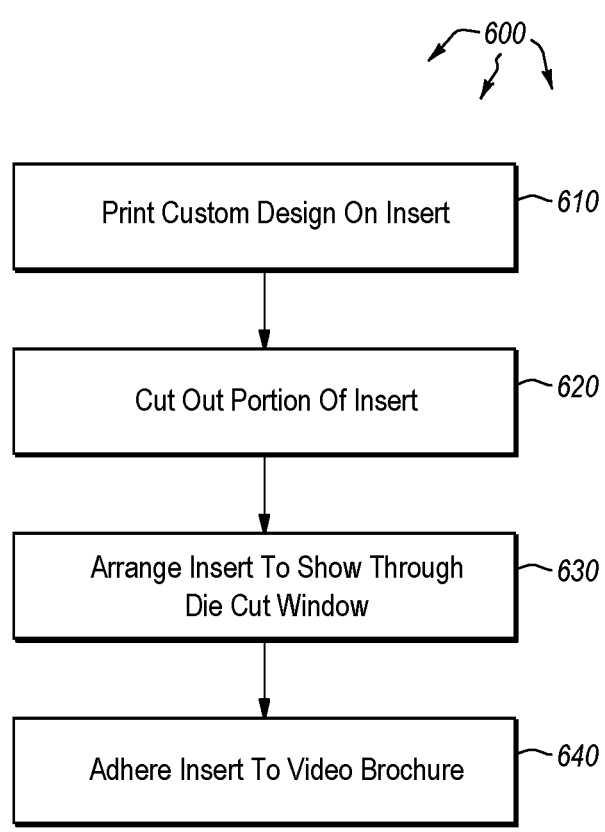
FIG. 6 illustrates a method for personalizing marketing materials such as video brochures.

In view of the systems and apparatuses described above, methodologies that may be implemented in accordance with the disclosed subject matter will be better appreciated with reference to the flow charts of FIG. 6. For purposes of simplicity of explanation, the methodologies are shown and described as a series of blocks. However, it should be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter.

FIG. 6 illustrates a flowchart of a method 600 for personalizing marketing materials such as video brochures. The method 600 will now be described with frequent reference to the electronic marketing apparatus 100 of FIGS. 1A-1D, along with its various features and components.

Method 600 describes a method for personalizing a video brochure. The method includes printing a custom design on an insert using a commodity printer (610), cutting out at least a portion of the insert (620), arranging the cut out portion of the insert to show through a die cut window of the video brochure (630), and adhering the cut out portion of the insert to the video brochure in the arranged position (640). The custom design 102 printed on the insert 105 may be selected or designed by a user. The user may then cut out the part of the insert that has the custom design printed thereon. Alternatively, this portion may be cut out with a die cut. The cut out portion of the insert 105 may be arranged so as to show through window 101. Once arranged in the proper position, the cut out portion may be secured in place using tape, glue or some other adhering means.

In some case, the insert may be placed in a housing 110 that has been pre-printed. For example, in cases where the electronic marketing apparatus 100 is a video brochure, the housing 110 may be pre-printed with a design or logo. This printing may occur prior to printing the custom design 102 on the insert 105 using the commodity printer. Thus, in this manner, one or more housings may be pre-printed with some logo or design, or may be left blank. These housings may then be used with the printed inserts 105 to create a customized video brochure that is economically producible at small scales. The finished size of the video brochure and the actual size or shape of the die cut window are both variable, and can be changed for different applications or different users. Use of the die cut window 101 in any size or shape allows personalization of the video brochure or other type of electronic marketing apparatus.

Accordingly, customers may print their name, logo, design, etc. onto a provided sheet of cardstock that is commodity-printer friendly. Once the cardstock is printed it may be cut out and arranged to show through the die cut window. The cardstock piece will be adhered to the brochure showing through the die cut panel. The insert may then be permanently secured via industrial double stick tape, for example. This creates a fit and finished piece that maintains the quality expected in a video brochure.

The concepts and features described herein may be embodied in other specific forms without departing from their spirit or descriptive characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An electronic marketing system, comprising:
an electronic display; and
a housing associated with the electronic display, the housing comprising:
a first flap comprising a plurality of tabs extending therefrom and a first window cut into the first flap allowing the electronic display to be viewable through the first window when the housing is associated with the electronic display;
a second flap connected to the first flap at a first fold, wherein the plurality of tabs extending from the first flap are configured to be folded toward the second flap to maintain a space between the first flap and the second flap when the first flap is folded over the second flap at the first fold, wherein the electronic display is configured to fit within the space between the first flap and the second flap when the first flap is folded over the second flap at the first fold; and
a third flap connected to the second flap at a second fold and comprising a second window configured to provide a view of at least a portion of an insert associated with the third flap.

2. The electronic marketing system of claim 1, wherein the second window is cut to a user-selected shape and/or size.

3. The electronic marketing system of claim 2, wherein the second window is die cut.

4. The electronic marketing system of claim 1, wherein the housing comprises a user-selected pattern.

5. The electronic marketing system of claim 1, wherein the third flap comprises a pattern identifying a size, shape, and location of the second window, wherein removal of the pattern from the third flap forms the second window.

6. The electronic marketing system of claim 1, wherein the insert comprises a cardstock insert, and wherein the cardstock insert is printable on a commodity printer.

7. The electronic marketing system of claim 6, wherein the cardstock insert is viewable through the second window.

8. The electronic marketing system of claim 1, wherein the first flap comprises a custom printed logo, design, or name.

9. An electronic marketing system, comprising:
an electronic display; and
a housing associated with the electronic display, the housing comprising:
a first flap comprising a plurality of tabs extending therefrom and a first window cut into the first flap allowing the electronic display to be viewable through the first window when the housing is associated with the electronic display;
a second flap connected to the first flap at a first fold, wherein the plurality of tabs extending from the first flap are configured to be folded toward the second flap to maintain a space between the first flap and the second flap when the first flap is folded over the second flap at the first fold; and
a third flap connected to the second flap at a second fold and comprising a second window configured to provide a view of at least a portion of an insert associated with the third flap;
wherein an assembled housing comprises:
the first flap folded substantially over the second flap at the first fold;
the plurality of tabs extending from the first flap being folded toward the second flap to maintain the space between the first flap and the second flap; and
the third flap folded substantially over the second flap, the second window being opposite the first window and having the second flap disposed therebetween.

10. The electronic marketing system of claim 9, wherein the insert is disposed between the second flap and the third flap.

11. The electronic marketing system of claim 9, wherein the housing further comprises a fourth flap connected to the third flap at a third fold.

12. The electronic marketing system of claim 11, wherein the assembled housing additionally comprises the fourth flap folded over at least a portion of the first flap comprising the first window.

13. The electronic marketing system of claim 12, wherein the fourth flap comprises a magnet for magnetically securing the fourth flap over the portion of the first flap comprising the first window.

14. An electronic marketing system, comprising:
an electronic display; and
a housing associated with the electronic display, the housing comprising:
a first flap comprising a plurality of tabs extending therefrom and a first window cut into the first flap allowing the electronic display to be viewable through the first window;
a second flap connected to the first flap at a first fold, wherein the plurality of tabs extending from the first flap are configured to be folded toward the second flap to maintain a space between the first flap and the second flap when the first flap is folded over the second flap at the first fold;
a third flap connected to the second flap at a second fold and comprising a second window; and
a fourth flap connected to the third flap at a third fold, wherein an assembled housing comprises the fourth flap folded over at least a portion of the first flap comprising the first window.

15. The electronic marketing system of claim 14, wherein the fourth flap comprises a magnet for magnetically securing the fourth flap over the portion of the first flap comprising the first window.

16. The electronic marketing system of claim 14, wherein the first and/or second windows form a polygonal shape.

17. The electronic marketing system of claim 14, wherein the first and/or second windows are at least partially defined by an arcuate sidewall.

18. The electronic marketing system of claim 14, wherein at least one of the third or fourth flaps comprises an adhesive strip.

* * * * *